United States Patent [19]
Takahashi

[11] Patent Number: 5,848,007
[45] Date of Patent: Dec. 8, 1998

[54] REDUNDANCY CIRCUIT FOR SEMICONDUCTOR STORAGE APPARATUS

[75] Inventor: Yasuhiko Takahashi, Tokyo, Japan

[73] Assignee: Nippon Steel Corporation, Tokyo, Japan

[21] Appl. No.: 901,952

[22] Filed: Jul. 29, 1997

[30] Foreign Application Priority Data

Aug. 6, 1996 [JP] Japan .................................. 8-223196

[51] Int. Cl.⁶ .................................................. G11C 7/00
[52] U.S. Cl. ...................................... 365/200; 365/225.7
[58] Field of Search ............................... 365/200, 225.7, 365/230.06, 230.03

[56] References Cited

U.S. PATENT DOCUMENTS

| 5,528,539 | 6/1996 | Ong et al. | 365/200 |
| 5,566,128 | 10/1996 | Magome | 365/200 |

FOREIGN PATENT DOCUMENTS

| A-7-85689 | 3/1995 | Japan . |
| A-7-93990 | 4/1995 | Japan . |

OTHER PUBLICATIONS

M. Itoh, *Advanced Electronics I–9 ultra LSI Memory*, Baifukan Co., pp. 181–183, 1994.

T. Nakano et al, *ULSI DRAM Technology*, Science Forum Co., pp. 67–70, 1992.

T. Iizuka, *Design of CMOS Ultra LSI*, Baifukan Co., pp. 194–196, 1989.

*Primary Examiner*—Vu A. Le
*Attorney, Agent, or Firm*—Pollock, Vande Sande & Priddy

[57] ABSTRACT

A redundancy circuit for a semiconductor storage apparatus controls replacement of a normal system memory cell by a redundant system memory cell. Each of first and second fuse circuits include fuses provided in correspondence to individual bits of an address signal constituted by a plurality of bits for designating an address of the normal system memory cell, and outputs an output signal of high level or low level in dependence on whether or not the fuse is broken or not. A non-redundancy decision unit decides whether the normal system memory cell is to be used or not on the basis of the output signals of the first and second fuse circuits to thereby output a non-redundancy flag indicating result of the decision. A MOS transistor has a gate terminal applied with the non-redundancy flag and is changed over between a conducting state and a non-conducting state in dependence on the non-redundancy flag. An address decoder for the normal system memory cell decodes the address signal when the MOS transistor is in the conducting state.

10 Claims, 6 Drawing Sheets

REDUNDANCY CIRCUIT FOR SEMICONDUCTOR STORAGE APPARATUS

BACKGROUND OF THE INVENTION

1. Field of the Invention

The present invention relates to a redundancy circuit for a semiconductor storage apparatus, and more particularly to a redundancy circuit for a semiconductor storage apparatus suited advantageously for use upon occurrence of a defective memory cell in a DRAM (Dynamic random Access Memory) to replace the defective memory cell by a spare memory cell provided in advance.

2. Description of the Related Art

When a semiconductor integrated circuit formed on a chip has a defective part, the semiconductor integrated circuit is regarded as being of no value as a manufactured article even if most parts of the semiconductor integrated circuit function normally. Accordingly, the chip suffering from such defect is discarded as waste. Thus, the chip manufactured at no negligible cost is rendered useless. Accordingly, it is desirable that even the partially defective semiconductor integrated circuit can be used as a manufactured article.

Under the circumstances, there has been proposed a method of remedying a semiconductor integrated circuit upon occurrence of a partial defect in the semiconductor integrated circuit by replacing the defective circuit portion by a spare circuit. By way of example, in a redundancy circuit for a semiconductor storage apparatus such as a DRAM and the like, a spare memory cell (referred to as "a redundant system memory cell") is provided in advance in a peripheral portion of a memory array, wherein when a defect occurs partially in the memory array, a memory cell suffering the defect (referred to as "a defective memory cell") is replaced by the spare memory cell (see Itoh's: "ADVANCED ELECTRONICS I-9 ULTRA LSI MEMORY" published by Baifukan Ltd., pp. 181–183, (1994); Nakano et al's "ULSI DRAM TECHNIQUES" published by Science Forum Ltd., pp. 67–70, (1992); Iizuka's "CMOS ULSI DESIGNS" published by Baifukan Ltd., pp. 194–196 (1989) and others). In more concrete, in the case of a semiconductor storage apparatus shown in FIG. 1, there are prepared previously in peripheral portions of a memory cell 101 eight rows of spare memory cells 102 for word lines and four rows of spare memory cells 103 for bit lines, wherein upon appearance of defective memory cell 104 along the word line WL thereof, the defective memory cell 104 is replaced by the spare memory cell 102 for the word line. In that case, replacement of the memory cell is performed in general by handling the four rows of memory cells as one unit. Accordingly, in the case of the above-mentioned example, four rows of memory cells arrayed in the word line direction and containing the defective memory cell 104 are replaced by the four rows of spare memory cells 102 for the word line.

In the semiconductor storage apparatus of the type mentioned above, it is required to store a program in an internal circuit of a memory device to determine for which of address signals the spare memory cell (redundant system memory cell) is to be used before shipping of the semiconductor storage apparatus as the manufactured article (before packaging of the semiconductor storage apparatus). The programming to this end is generally realized by breaking off a fuse provided externally of the memory cell. More specifically, when a defective memory cell is detected by the inspection in precedence to the packaging, the fuse provided in correspondence to the address of the word line (or bit line) to which the defective memory cell of concern is connected is broken by using a laser beam or the like. In this way, the address of the defective memory cell (hereinafter referred to as "defect address") is stored to disable the use of the defective memory cell upon designation of the defect address.

Next, description will be made in detail of the programming by breaking the fuse. In this context, it is assumed, by way of example only, that the address signal for selecting the word line is composed of eight-bit address signals $A_0$ to $A_7$. Accordingly, the number of the word lines for the memory array amounts to 256 ($=2^8$) in total. In this conjunction, because provision of the fuse for each of all the 256 word lines is not preferred in view of the layout of the chip, a pre-decode processing for decoding the address signal on a several-bit basis is performed in precedence to a main-decode processing.

For instance, in the case of an example illustrated in FIG. 2, three more significant bits $A_7$ to $A_5$ of the eight-bit address signals $A_0$ to $A_7$ are inputted to a first pre-decoder $160_1$ to be thereby converted into eight internal address signals. Three medial significant bits $A_4$ to $A_2$ of the eight-bit address signals $A_0$ to $A_7$ are inputted to a second pre-decoder $160_2$ to be converted into eight internal address signals. Two less significant bits $A_1$ and $A_0$ of the eight-bit address signals $A_0$ to $A_7$ are inputted to a third pre-decoder $160_3$ to be thereby converted into four internal address signals. The eight internal address signals outputted from the first pre-decoder $160_1$ are inputted to a first fuse circuit $164_1$. The eight internal address signals outputted from the second pre-decoder $160_2$ are inputted to a second fuse circuit $164_2$. The four internal address signals outputted from the third pre-decoder $160_3$ are inputted to a third fuse circuit $164_3$.

In each of the fuse circuits $164_1$ to $164_3$, circuits each constituted by a series connection of a fuse and an NMOS transistor are incorporated in a number corresponding to that of the internal address signals as inputted and the circuits are connected in parallel. In more concrete, the first fuse circuit $164_1$ is comprised of eight fuses $F_1$ to $F_8$ and eight NMOS transistors $Q_1$ to $Q_8$. The NMOS transistors $Q_1$ to $Q_8$ have respective gate terminals to which internal address signals outputted from the first pre-decoder $160_1$ are applied, respectively. All the source terminals of the NMOS transistors $Q_1$ to $Q_8$ are grounded. The drain terminals of the NMOS transistors $Q_1$ to $Q_8$ are connected to one ends of the fuses $F_1$ to $F_8$, respectively. On the other hand, all the other ends of the fuses $F_1$ to $F_8$ are connected to a drain terminal of a pre-charge PMOS transistor 161, and a drain terminal of a pull-up PMOS transistor 162 and an input terminal of an inverter 163. The second fuse circuit $164_2$ and the third fuse circuit $164_3$ are implemented in the configuration similar to that of the first fuse circuit $164_1$.

The source terminal of the precharge PMOS transistor 161 as well as the source terminal of the pull-up PMOS transistor 162 is connected to a supply voltage terminal. The output terminal of the inverter 163 is connected to the gate terminal of the pull-up PMOS transistor 162.

When the pre-charge PMOS transistor 161 is turned on for putting into operation the redundancy circuit implemented in the structure described above, the potential at a common contact X of the individual fuses of the first to third fuse circuits $164_1$ to $164_3$ is precharged to a high level. In this state, even when the internal address signal of high level is inputted, for example, to the gate terminal of the NMOS transistor $Q_1$ of the first fuse circuit $164_1$ from the first pre-decoder $160_1$ to thereby turn on the NMOS transistor $Q_1$ the potential at the common contact X is prevented from being discharged in case the fuse $F_1$ having one end connected to the drain terminal of the NMOS transistor $Q_1$ is fuse d or broken off. Besides, because the potential at the common contact X is inputted to the gate terminal of the pull-up PMOS transistor 162 by way of the inverter 163, the pull-up PMOS transistor 162 becomes conductive, whereby the potential at the common contact X is held at high level. On the other hand, in case the fuse $F_1$ is not broken or fused off, the level of the potential at the common contact X becomes low due to discharge.

In this way, the defect address can be stored by breaking the one of the fuses in the first to third fuse circuits $164_1$ to $164_3$ which corresponds to the defect address, while by monitoring the potential at the common contact X, decision can be made whether the redundant system memory cell (spare memory cell) is to be used or not. To say in another way, when the potential at the common contact X is at high level due to the breaking of the fuse, it is decided to use the redundant system memory cell, whereas when the potential at the common contact X is at low level, it is decided not to use the redundant system memory cell.

However, with the redundancy circuit of the structure described above, there arises a problem that some time is taken for making the decision as to use/nonuse of the redundant system memory cell. In other words, even when the NMOS transistor of the fuse circuit becomes conductive upon inputting of the defect address, some time is taken for the potential level at the common contact X to become completely low because the potential at the common contact X lowers only gradually.

As a method of coping with the problem mentioned above, there has been proposed a method of constituting each of the fuse circuits by using two fuse circuit units each implemented in the same structure as the fuse circuit shown in FIG. 2, wherein the internal address signals are inputted to the fuse circuit units for making decision as to the use or nonuse of the redundant system memory cell on the basis of the potential at the common contact in each fuse circuit unit (see e.g. JP-A-7-93990, JP-A-7-85689, etc.). By way of example, referring to FIG. 3, a first fuse circuit 260 is constituted by using first and second fuse circuit units $260_1$ and $260_2$ each of the same structure of the first fuse circuit $164_1$ shown in FIG. 2, wherein the potentials at common contacts X1 and X2 of the first and second fuse circuit units $260_1$ and $260_2$, respectively, are inputted to a decision circuit 265. When at least one of the potentials at the common contacts X1 and X2 is at high level, a redundant-system using flag is generated by the decision circuit 265. When the redundant-system using flag is outputted from the decision circuit 265, then it is regarded that the defect address is inputted, whereby the use of the redundant system memory cell is selected.

However, with the redundancy circuit of such arrangement as mentioned above, the decision circuit 265 has to be constituted by employing a large number of gate stages for enabling the decision concerning the use/nonuse of the redundant system memory cell. Besides, there also arises a problem that some time is taken for the decision to be made by the decision circuit 265. Additionally, the decision circuit 265 serves only for the decision as to the use/nonuse of the redundant system memory cell, and disabling of the use of the defective memory cell is effectuated by breaking off, for example, a disable fuse on the basis of the result of the decision made by the decision circuit 265, which presents an obstacle to an attempt for increasing the processing speed of the semiconductor storage apparatus as a whole.

In the case of a DRAM memory chip of large capacity such as of 16 megabytes or 64 megabytes, for example, four memory arrays 301 to 304 are disposed in four quadrants (first to fourth quadrants), respectively, on a chip, wherein row decoders 305 and 306 and column decoders 307 to 310 are disposed among the memory arrays 301 to 304 in such arrangement as shown in FIG. 4. A fuse/decision circuit 311 of the structure such as shown in FIG. 3 is disposed at a center location on the chip, and the redundant-system using flag outputted from the fuse/decision circuit 311 is supplied to the row decoders 305 and 306 and the column decoders 307 to 310.

However, disposition of the fuse/decision circuit 311 at a space separately from those for the memory arrays 301 to 304, the row decoders 305 and 306 and the column decoders 307 to 310 provides a factor for making it difficult to implement the chip in a compact structure. Additionally, wirings are required for supplying the redundant-system using flag outputted from the fuse/decision circuit 311 to the row decoders 305 and 306 and the column decoders 307 to 310, giving rise to another problem that the chip area is increased.

When the redundant-system using flag is outputted from the fuse/decision circuit 311, the use of the defective memory cell designated by the defect address has to be disabled, which is generally effectuated by breaking or fusing off the relevant one of the disable fuses provided in association with the word lines and the bit lines of the individual memory arrays 301 to 304.

Disposition of the disable fuses on the word lines and the bit lines will however be accompanied with an additional problem that other wires can not be disposed between the word lines as well as between the bit lines because of juxtaposed disposition of the disable fuses at high density.

SUMMARY OF THE INVENTION

An object of the present invention is to provide a redundancy circuit for a semiconductor storage apparatus which allows the processing speed of the semiconductor storage aparatus as a whole to be increased while making it possible to reduce the circuit scale and facilitate the wiring layout.

A first redundancy circuit for a semiconductor storage apparatus according to the present invention is directed to
  a redundancy circuit for a semiconductor storage apparatus for controlling replacement of a normal system memory cell by a redundant system memory cell, which circuit includes
  first and second fuse circuits each including fuses provided in correspondence to individual bits of an address signal constituted by a plurality of bits for designating an address of the aforementioned normal system memory cell, and each outputting an output signal of high level or low level in dependence on whether or not the aforementioned fuse is broken or not,
  non-redundancy decision means for deciding whether the normal system memory cell is to be used or not on the basis of the output signals of the first and second fuse circuits to thereby output a non-redundancy flag indicating result of the decision,
  a MOS transistor having a gate terminal applied with the aforementioned non-redundancy flag and changed over between a conducting state and a non-conducting state in dependence on the aforementioned non-redundancy flag, and
  an address decoder for the aforementioned normal system memory cell for decoding the aforementioned address signal when the aforementioned MOS transistor is in the conducting state.

In the case of the first redundancy circuit for the first semiconductor storage apparatus according to the present invention, when neither the fuse of the first fuse circuit nor that of the second fuse circuit is broken, the output signals of low level are outputted from the first and second fuse circuits, respectively, whereby decision is made by the non-redundancy decision means that the normal system memory cell is to be used. In that case, the non-redundancy flag of high level, for example, is outputted from the non-redundancy decision means to the gate terminal of the MOS transistor, which makes the MOS transistor conductive, whereby the address decoder for the normal system memory cell is put into operation.

On the other hand, when at least one of the fuses either of the first or second fuse circuit is broken or fused off, the output signal of high level, for example, is outputted from the fuse circuit whose fuse has been broken, whereby decision is made by the non-redundancy decision means that the normal system memory cell is not to be used. In that case, the non-redundancy flag of low level, for example, is outputted from the non-redundancy decision means to the gate terminal of the MOS transistor, which makes the MOS transistor non-conductive, whereby the address decoder for the normal system memory cell is set to non-operating state. As a consequence, the use of the normal system memory cell is disabled. In other words, when the defect address is inputted to the first and second fuse circuits, the non-redundancy flag assumes, for example, low level, to thereby disable the use of the normal system memory cell.

Thus, with the first redundancy circuit for the semiconductor storage apparatus according to the present invention, the use of the normal system memory cell can be disabled without using the disable fuse or the like when the defect address is inputted to the first and second fuse circuits, while decision as to use/nonuse of the normal system memory cell and disabling of the use of the normal system memory cell can simultaneously be effectuated. Further, because the non-redundancy decision means can be implemented in a simplified structure, e.g. by resorting to a logical sum gate means, the time taken for making the decision as to use/nonuse of the normal system memory cell can be shortened.

A second redundancy circuit for a semiconductor storage apparatus according to the present invention further includes address selecting means for outputting a select signal for replacing the normal system memory cell by the redundant system memory cell when the output signal of the first fuse circuit and the output signal of the second fuse circuit have respective signal levels differing from each another.

In the second redundancy circuit for the semiconductor storage apparatus according to the present invention, when the output signal of the first fuse circuit is, for example, at high level with the output signal of the second fuse circuit being at low level, the select signal for replacing the normal system memory cell by the redundant system memory cell is outputted from the address selecting means. In that case, because the output signal of the first fuse circuit is of high level, the non-redundancy flag of low level, for example, is outputted from the non-redundancy decision means to the gate terminal of the MOS transistor, which makes the MOS transistor non-conductive, whereby the address decoder for the normal system memory cell is set to a non-operating state, as a result of which the use of the normal system memory cell is disabled, as mentioned previously.

More specifically, when the defect address is inputted to the first and second fuse circuits, the non-redundancy flag assumes, for example, low level, disabling the use of the normal system memory cell while enabling the use of the redundant system memory cell with the aid of the select signal outputted from the address selecting means. In this way, according to the second redundancy circuit for the semiconductor storage apparatus according to the present invention, disabling of use of the normal system memory cell and selection of the redundant system memory cell can be effectuated at the same time. Besides, selection of the redundant system memory cell can be realized with a small number of elements such as a pair of fuse circuits, four MOS transistors and the like.

In a third redundancy circuit for a semiconductor storage apparatus according to the present invention, a fuse decoder constituted by the first and second fuse circuits, the non-redundancy decision means and the address selecting means is disposed closely to the address decoder. Consequently, according to the third redundancy circuit for the semiconductor storage apparatus according to the present invention, wiring between the fuse decoder and the address decoder can be realized effectively.

DESCRIPTION OF THE PREFERRED EMBODIMENTS

In the following, description will be made of a redundancy circuit for a semiconductor storage apparatus according to an embodiment of the present invention by reference to the drawings. Although the description will be made for the convenience's sake on the assumption that the defective memory cell is to be replaced by a spare memory cell for the word line, it will readily be appreciated that the defective memory cell may be replaced by the spare memory cell for the bit line in a similar manner. Further, it is presumed that the address signal for selecting the word line is constituted by eight-bit address signals $A_0$ to $A_7$. Accordingly, the number of the word lines within the memory array amounts to $2^8=256$. Furthermore, the pre-decoding is performed in precedence to the main-decoding. In this conjunction, in the redundancy circuit for the semiconductor storage apparatus according to the instant embodiment, three-bit address signals $A_6$, $A_5$ and $A_4$ of the eight-bit address signals $A_0$ to $A_7$ are predecoded to generate eight internal address signals $a_0$ to $a_7$, while three-bit address signals $A_2$, $A_1$ and $A_0$ of the eight-bit address signals $A_0$ to $A_7$ are pre-decoded to generate eight internal address signals $a_8$ to $a_{15}$, and two-bit address signals $A_7$ and $A_3$ of the eight-bit address signals $A_0$ to $A_7$ are pre-decoded to generate four internal address signals $a_{16}$ to $a_{19}$.

Figure 5:
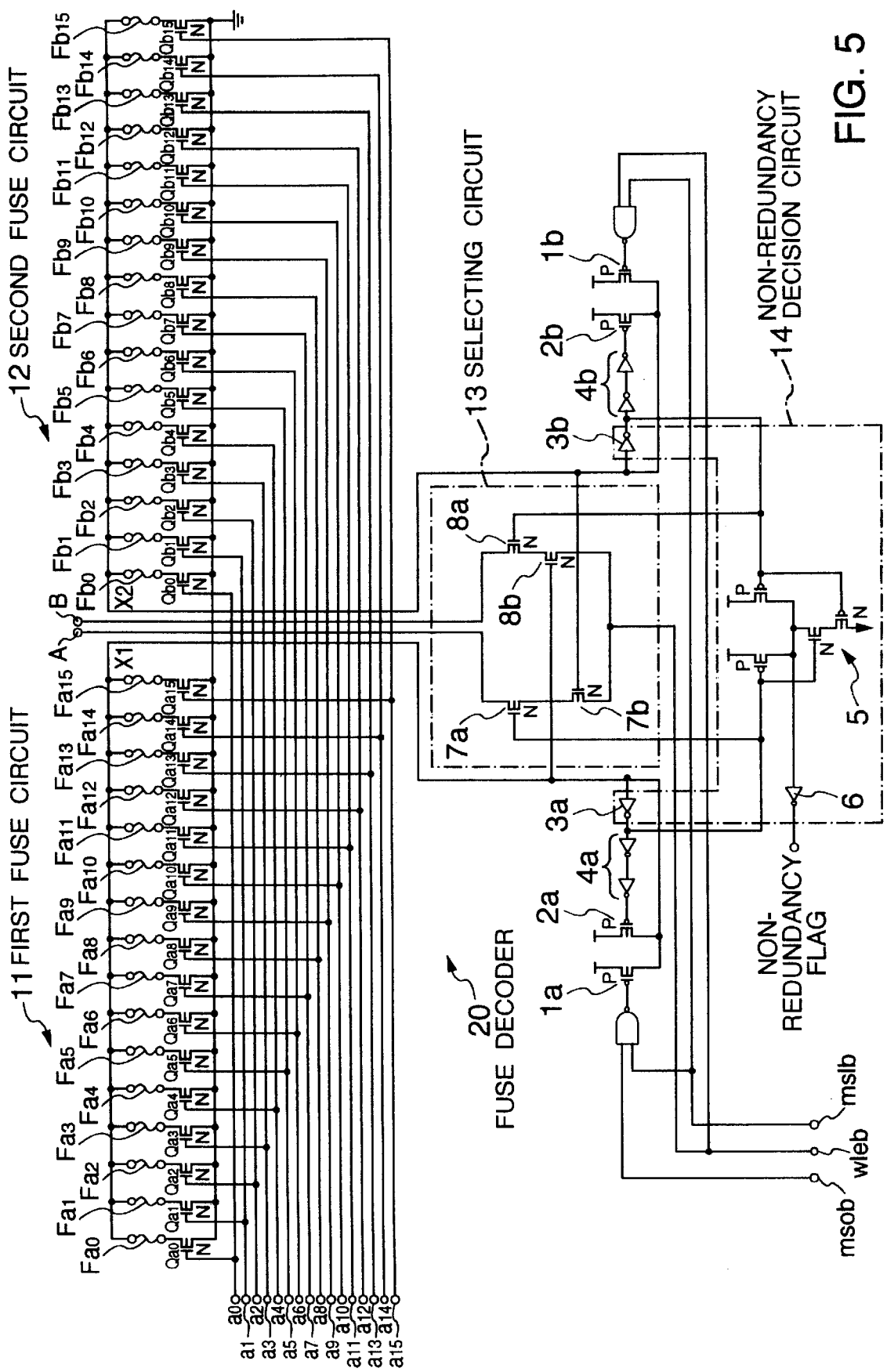
FIG. 5 is a circuit diagram showing an exemplary structure of a fuse decoder constituting a part of a redundancy circuit for a semiconductor storage apparatus according to an embodiment of the present invention.

A fuse decoder 20 which constitutes a part of the redundancy circuit for the semiconductor storage apparatus according to the instant embodiment includes first and second fuse circuits 11 and 12, each of which is constituted by sixteen circuits connected in parallel, wherein each of the circuits in turn is constituted by a fuse and an NMOS transistor connected in series to each other, as can be seen in FIG. 5. More specifically, the first fuse circuit 11 is comprised of sixteen fuses $Fa_0$ to $Fa_{15}$ and sixteen NMOS transistors $Qa_0$ to $Qa_{15}$. The NMOS transistors $Qa_0$ to $Qa_{15}$ have respective gate terminals to which the internal address signals $a_0$ to $a_{15}$ are applied, respectively. All the source terminals of the NMOS transistors $Qa_0$ to $Qa_{15}$ are grounded. The drain terminals of the NMOS transistors $Qa_0$ to $Qa_{15}$ are connected to one ends of the fuses $Fa_0$ to $Fa_{15}$, respectively. Similarly, the second fuse circuit 12 is comprised of sixteen fuses $Fb_0$ to $Fb_{15}$ and sixteen NMOS transistors $Qb_0$ to $Qb_{15}$. The NMOS transistors $Qb_0$ to $Qb_{15}$ have respective gate terminals to which the internal address signals $a_0$ to $a_{15}$ are applied, respectively. All the source terminals of the NMOS transistors $Qb_0$ to $Qb_{15}$ are grounded. The drain terminals of the NMOS transistors $Qb_0$ to $Qb_{15}$ are connected to one ends of the fuses $Fb_0$ to $Fb_{15}$, respectively.

All the other ends (constituting a common contact X1) of the fuses $Fa_0$ to $Fa_{15}$ of the first fuse circuit 11 are connected to an input terminal of a first inverter 3a, a drain terminal of a first pre-charge PMOS transistor 1a, and a drain terminal of a first pull-up PMOS transistor 2a. The output signal of the first inverter 3a is coupled to a gate terminal of the first pull-up PMOS transistor 2a by way of a first inverter set 4a including two inverters. The source terminal of the first pre-charge PMOS transistor 1a and the source terminal of the first pull-up PMOS transistor 2a are connected to a source voltage terminal. Inputted to the gate terminal of the first pre-charge PMOS transistor 1a are a mat select 0 signal ms0b (negative logic) and a mat select 1 signal ms1b (negative logic) via a NAND circuit.

Similarly, all the other ends (a common contact X2) of the fuses $Fb_0$ to $Fb_{15}$ of the second fuse circuit 12 are connected to an input terminal of a second inverter 3b, a drain terminal of a second pre-charge PMOS transistor 1b, a drain terminal of a second pull-up PMOS transistor 2b. The output signal of the second inverter 3b is coupled to a gate terminal of a second pull-up PMOS transistor 2b by way of a second inverter set 4b including two inverters. The source terminal of the second pre-charge PMOS transistor 1b and the source terminal of the second pull-up PMOS transistor 2b are connected to a source voltage terminal. Inputted to the gate terminal of the second pre-charge PMOS transistor 1b are a mat select 0 signal ms0b and a mat select 1 signal ms1b via a NAND circuit.

The fuse decoder 20 further includes an address selecting circuit 13 which is comprised of a first NMOS transistor 7a, a second NMOS transistor 7b, a third NMOS transistor 8a and a fourth NMOS transistor 8b, wherein the first and second NMOS transistors 7a and 7b are connected in series with the drains thereof being connected to each other. Further, the third and fourth NMOS transistors 8a and 8b are connected in series with the drains thereof being connected to each other. Inputted to the gate terminal of the first NMOS transistor 7a is the output signal of the first inverter 3a while a signal on the common contact X2 of the second fuse circuit 12 is inputted to the gate terminal of the second NMOS transistor 8a. Inputted to the gate terminal of the third NMOS transistor 8a is the output signal of the second inverter 3b while the signal on the common contact X1 of the first fuse circuit 11 is inputted to the gate terminal of the fourth NMOS transistor 8b. A word line enable timing signal (negative logic) w1eb is inputted to the source terminal of the second NMOS transistor 7b and the source terminal of the fourth NMOS transistor 8b.

The fuse decoder 20 further includes a NAND circuit 5 which is comprised of two PMOS transistors and two NMOS transistors and a third inverter 6, wherein the NAND circuit 5 serves for determining a logical product between the output signal of the first inverter 3a and that of the second inverter 3b. The first inverter 3a, the second inverter 3b, the NAND circuit 5 and the third inverter 6 cooperate to function as a NOR gate to realize a non-redundancy decision circuit 14.

In the fuse decoder 20 implemented in the structure described above, when the mat select 0 signal ms0b and the mat select 1 signal ms1b are inputted to the gate terminals of the first and second pre-charge PMOS transistors 1a and 1b via the two NAND circuits, the first and second pre-charge PMOS transistors 1a and 1b assume the conducting states, whereby the common contacts X1 and X2 of the first and second fuse circuits 11 and 12 are precharged to high-level potential.

In this conjunction, it is to be noted that because the eight internal address signals $a_0$ to $a_7$ of the sixteen internal address signals $a_0$ to $a_{15}$ inputted to the fuse decoder 20 are generated by pre-decoding the three-bit address signals $A_6$, $A_5$ and $A_4$ of the eight-bit address signals $A_0$ to $A_7$, only one of the eight internal address signals is at high level. Furthermore, because the remaining eight internal address signals $a_8$ to $a_{15}$ are generated by pre-decoding the three-bit address signals $A_2$, $A_1$ and $A_0$ of the eight-bit address signals $A_0$ to $A_7$, only one of the eight internal address signals is at high level. Accordingly, for the simplification of description, it is assumed that the internal address signals $a_2$ and $a_{13}$ are at high level.

When the internal address signals $a_0$ to $a_{15}$ are inputted to the gate terminals of the sixteen NMOS transistors $Qa_0$ to $Qa_{15}$ of the first fuse circuit 11 as well as to the gate terminals of sixteen NMOS transistors $Qb_0$ to $Qb_{15}$ of the second fuse circuit 12, then the NMOS transistors $Qa_2$ of the first fuse circuit 11 and the NMOS transistors $Qb_2$ of the second fuse circuit 12, both transistors having the respective gate terminals applied with the high-level internal address signals $a_2$, become conductive, and at the same time the NMOS transistors $Qa_{13}$ of the first fuse circuit 11 and the NMOS transistors $Qb_{13}$ of the second fuse circuit 12, both transistors having the respective gate terminals applied with the high-level internal address signals $a_{13}$, become conductive. The NMOS transistors $Qa_0$, $Qa_1$, $Qa_3$ to $Qa_{12}$, $Qa_{14}$ and $Qa_{15}$ as well as the NMOS transistors $Qb_0$, $Qb_1$, $Qb_3$ to $Qb_{12}$, $Qb_{14}$ and $Qb_{15}$ are all in the non-conducting state.

In that case, when both the fuses $Fa_2$ and $Fa_{13}$ connected to the drain terminals of the two conducting NMOS transistors $Qa_2$ and $Qa_{13}$ of the first fuse circuit 11 are broken or fused off, the potential at the common contact X1 is not discharged but the common contact X1 is maintained at high level potential by the first pull-up PMOS transistor 2a via the first inverter 3a and the first inverter set 4a, even when the NMOS transistors $Qa_2$ and $Qa_{13}$ become conductive in response to application of the internal address signals $a_2$ and $a_{13}$ of high level to the gate terminals of these NMOS transistors $Qa_2$ and $Qa_{13}$, respectively. On the other hand, when at least one of the fuses $Fa_2$ and $Fa_{13}$ is not broken, the potential at the common contact X1 is discharged to low level when the internal address signals $a_2$ and $a_{13}$ of high level are inputted to the gate terminals of the NMOS transistors $Qa_2$ and $Qa_{13}$, respectively, whereby the NMOS transistors $Qa_2$ and $Qa_{13}$ are turned to the conducting state.

Similarly, when both the fuses $Fb_2$ and $Fb_{13}$ connected to the drain terminals of the two conducting NMOS transistors $Qb_2$ and $Qb_{13}$ in the second fuse circuit 12 are broken or fused off, the potential at the common contact X2 is not discharged but it is maintained at high level potential by the second pullup PMOS transistor 2b via the second inverter 3b and the second inverter set 4b even when the NMOS transistors $Qb_2$ and $Qb_{13}$ become conductive due to application of the internal address signals $a_2$ and $a_{13}$ of high level to the gate terminals of the NMOS transistors $Qb_2$ and $Qb_{13}$, respectively. On the other hand, when at least one of the fuses $Fb_2$ and $Fb_{13}$ is not broken, the potential at the common contact X2 is discharged to low level when the internal address signals $a_2$ and $a_{13}$ of high level are inputted to the gate terminals of the NMOS transistors $Qb_2$ and $Qb_{13}$, respectively, to thereby turn on the NMOS transistors $Qb_2$ and $Qbl_3$.

Thus, when the internal address signals $a_0$ to $a_{15}$ corresponding to the defect address (in which only the internal address signals $a_2$ and $a_{13}$ are of high level) are inputted to the first fuse circuit 11 due to breakage of the two fuses $Fa_2$ and $Fa_{13}$ of the first fuse circuit 11, the potential at the common contact X1 is caused to remain at high level, whereas the potential at the common contact X1 assumes low level when the other internal address signals $a_0$ to $a_{15}$ are inputted to the first fuse circuit 11. Similarly, when the internal address signals $a_0$ to $a_{15}$ corresponding to the defect address (in which only the internal address signals $a_2$ and $a_{13}$ are of high level) are inputted to the second fuse circuit 12 due to breakage of the two fuses $Fb_2$ and $Fb_{13}$ of the second fuse circuit 12, the potential at the common contact X2 remains at high level, whereas the potential at the common contact X2 becomes low when the other internal address signals $a_0$ to $a_{15}$ corresponding to the normal addresses are inputted to the second fuse circuit 12.

However, in practical applications, breakage of the fuses corresponding to the same address in the first fuse circuit 11 and the second fuse circuit 12 can not occur. This is because the pair of fuses is provided for the purpose of remedying the defect of two different addresses and because only fuse in either one of the fuse circuits is broken while the fuse of the other fuse circuit is not broken at all if the address to be remedied is only one.

The signal on the common contact X1 of the first fuse circuit 11 is inputted to the NAND circuit 5 via the first inverter 3a while the signal on the common contact X2 of the second fuse circuit 12 is inputted to the NAND circuit 5 via the second inverter 3b. The output signal of the NAND circuit 5 is inputted to the third inverter 6. Thus, the logical sum between the signal on the common contact X1 and the signal on the common contact X2 can be determined. As a result of this, there is outputted from the third inverter 6 a signal which assumes high level only when both the potential at the common contact X1 and the potential at the common contact X2 are simultaneously at low level.

Figure 1:
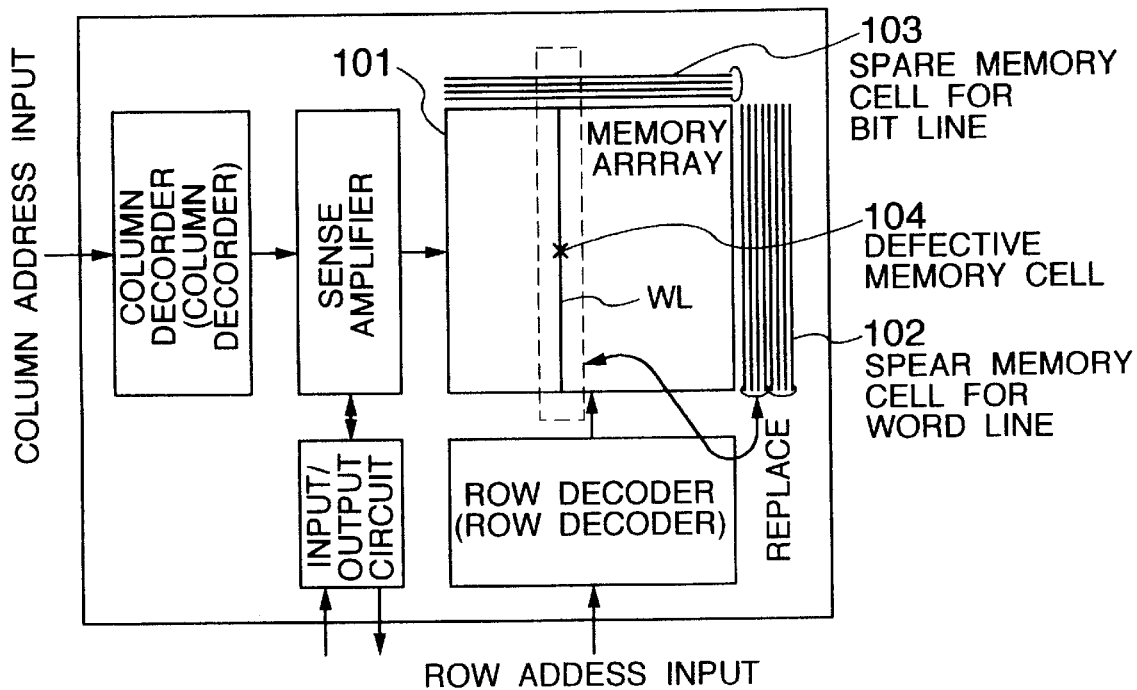
FIG. 1 is a diagram showing a structure of a general DRAM.
Figure 2:
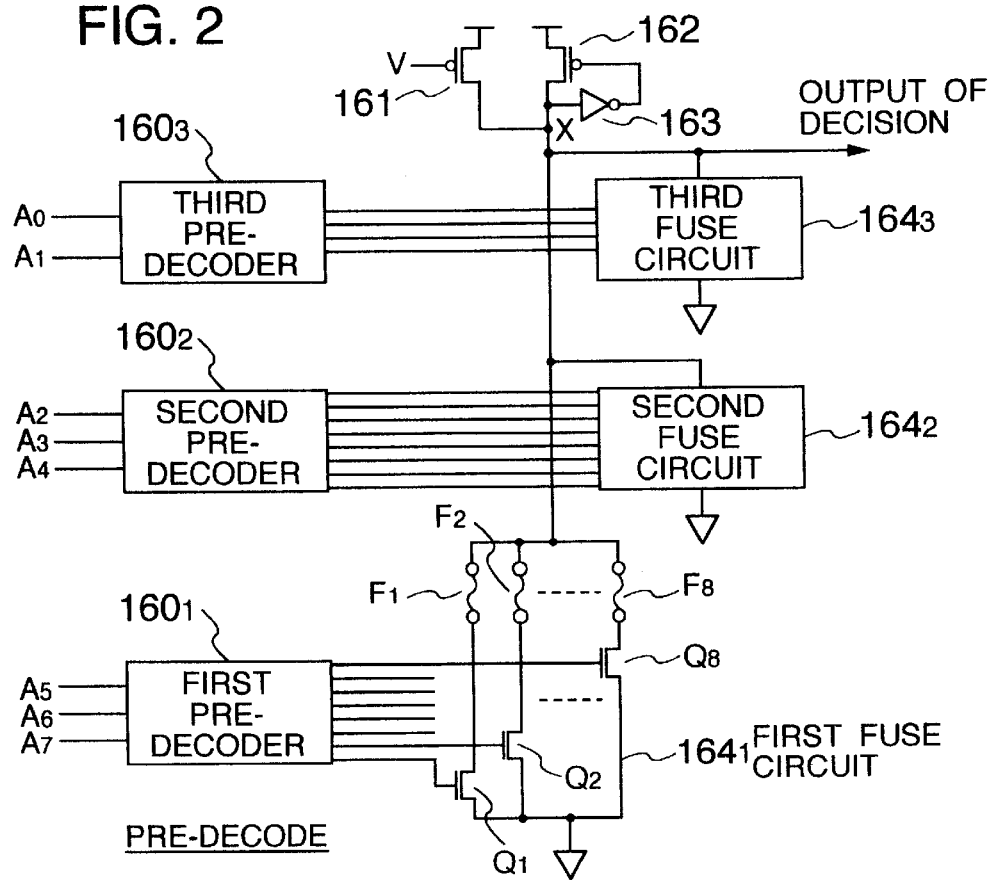
FIG. 2 is a block diagram showing an exemplary structure of, a redundancy circuit.
Figure 3:
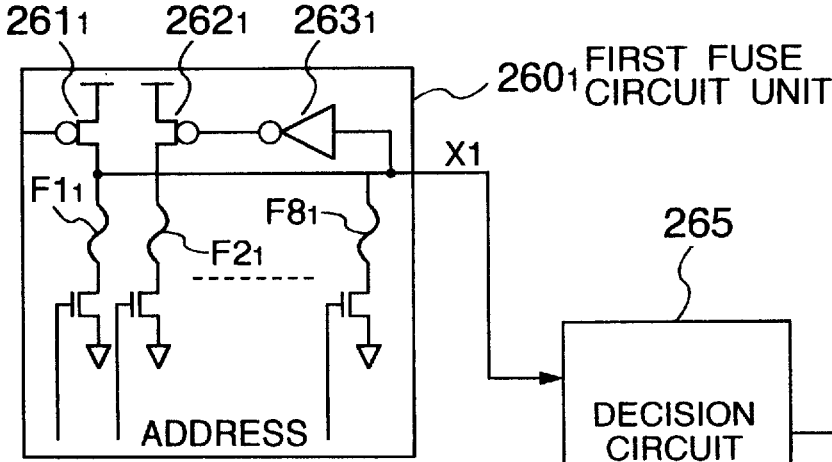
FIG. 3 is a block diagram showing another exempla structure of the redundancy circuit.
Figure 3:
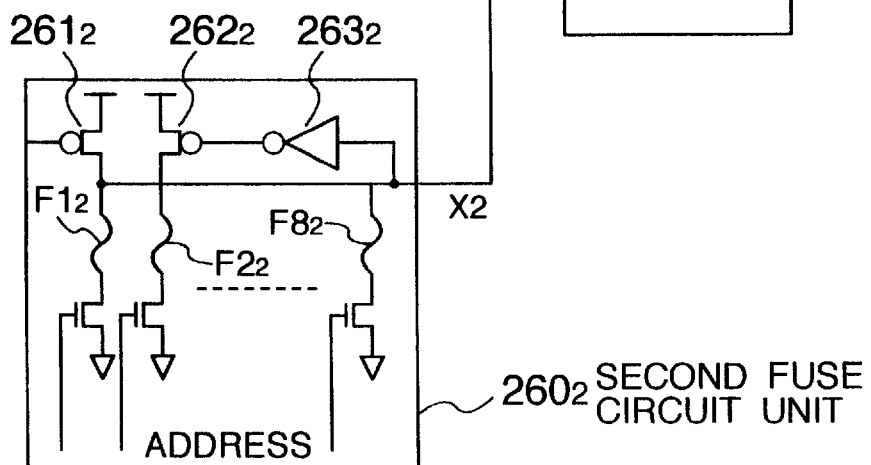
Figure 4:
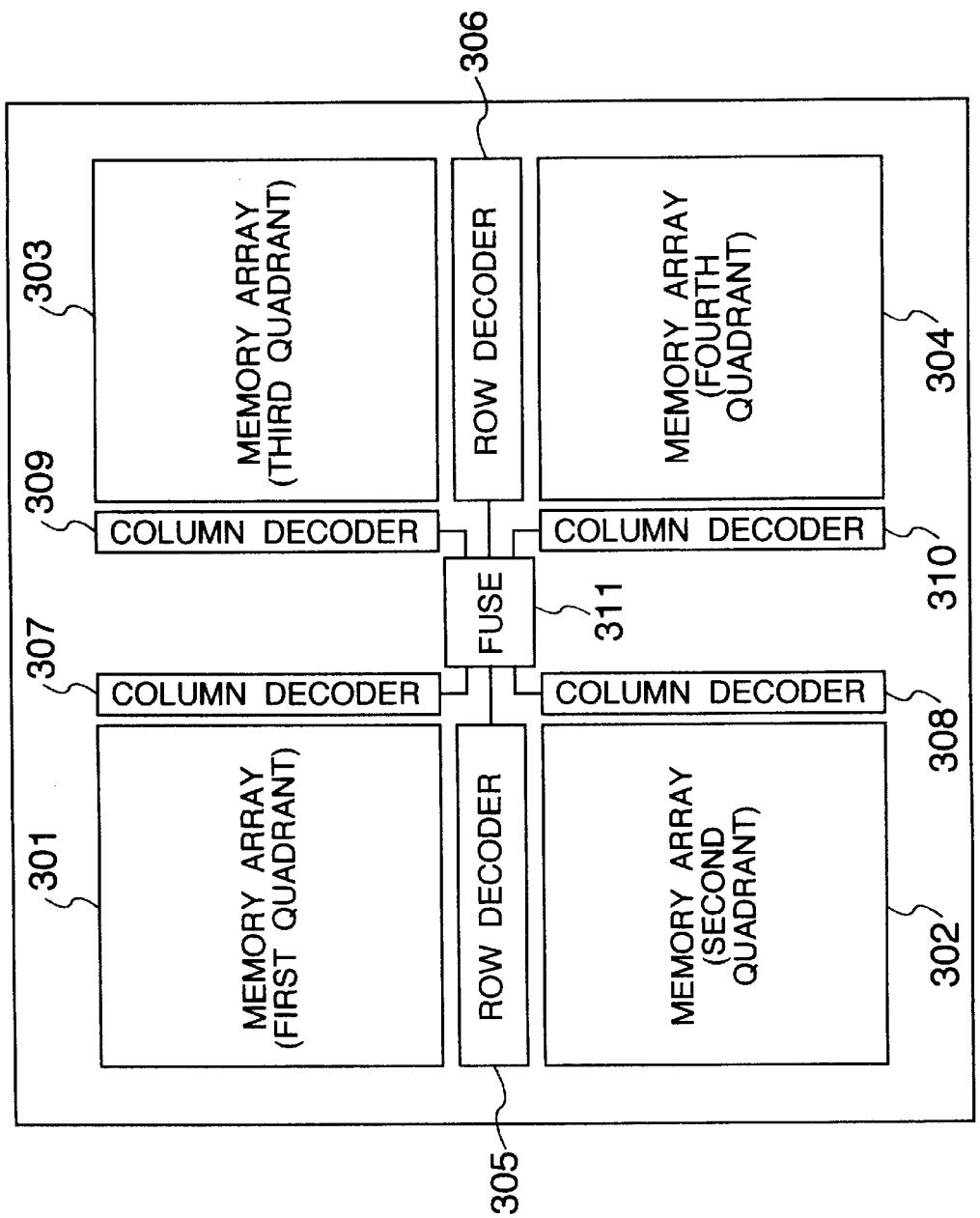
FIG. 4 is a view showing an exemplary layout of a semiconductor storage apparatus as a whole.

In this context, the fact that the potential at the common contact X1 and the potential at the common contact X2 are both at low level means that the internal address signals $a_0$ to $a_{15}$ inputted to the fuse decoder 20 do not correspond to the defect address (i.e., that the redundant system memory cell is not to be used). Accordingly, the output signal of the third inverter 6 which assumes high level only when both the potential at the common contact X1 and the potential at the common contact X2 assume low level can be used as the non-redundancy flag f (normal-system using flag). Thus, it can be understood that the redundancy circuit for the semiconductor storage apparatus according to the instant embodiment differs from the redundancy circuit shown in FIG. 3 in that the non-redundancy flag f can be generated instead of the redundant-system using flag. In that case, because the non-redundancy flag f is generated by the NOR circuit of a simplified structure, generation of the non-redundancy flag f (i.e., decision concerning the use/nonuse of the normal system memory cell) can be realized within a short time.

Next, description will turn to operation of the selecting circuit 13. The selecting circuit 13 is set to the operation-enabled state upon inputting of the word line enable timing signal wleb to the drain terminals of the second and fourth NMOS transistors 7b and 8b.

When both the potential at the common contact X1 and the potential at the common contact X2 are at low level, not only the second NMOS transistor 7b having the gate terminal applied with the potential of the common contact X2 but also the fourth NMOS transistor 8b having the gate terminal applied with the potential of the common contact X1 assumes the non-conducting state. Consequently, the select signal A of high level is outputted from the source terminal of the first NMOS transistor 7a while the select signal B of high level is outputted from the source terminal of the third NMOS transistor 8a.

By contrast, when both the potential at the common contact X1 and the potential at the common contact X2 are simultaneously at high level, not only the first NMOS transistor 7a having the gate terminal applied with the potential of the common contact X1 via the first inverter 3a but also the third NMOS transistor 8a having the gate terminal applied with the potential of the common contact X2 via the second inverter 3b assumes the non-conducting state. Consequently, the select signal A of high level is outputted from the source terminal of the first NMOS transistor 7a while the select signal B of high level is outputted from the source terminal of the third NMOS transistor 8a.

When the potential at the common contact X1 is at high level with the potential at the common contact X2 being at low level, the second NMOS transistor 7b having the gate terminal to which the potential of the common contact X2 is inputted becomes non-conductive, as a result of which the select signal A of high level is outputted from the source terminal of the first NMOS transistor 7a. On the other hand, the fourth NMOS transistor 8b having the gate terminal to which the potential of the common contact X1 is inputted becomes conductive, as a result of which the third NMOS transistor 8a whose gate terminal is applied with the potential of the common contact X2 via the second inverter 3b also becomes conductive. Thus, the select signal B of low level is outputted from the source terminal of the third NMOS transistor 8a.

On the contrary, when the potential at the common contact X1 is at low level with the potential at the common contact X2 being at high level, the second NMOS transistor 7b having the gate terminal to which the potential of the common contact X2 is inputted becomes conductive, while the first NMOS transistor 7a whose gate terminal is applied with the potential of the common contact X1 via the first inverter 3a also becomes conductive, as a result of which the select signal A of low level is outputted from the source terminal of the first NMOS transistor 7a. On the other hand, the fourth NMOS transistor 8b having the gate terminal to which the potential of the common contact X1 is applied becomes non-conductive. Thus, the select signal B of high level is outputted from the source terminal of the third NMOS transistor 8a.

As is apparent from the above, when the potential at the common contact X1 and the potential at the common contact X2 differ from each other, either one of the select signal A or B outputted from the selecting circuit 13 is at low level. In practical applications, this means that the inputted address coincides with the address to be remedied. As mentioned previously, the two sets of fuses are provided for the purpose of remedying detect of the two different addresses. In that case, since either one of the potential at the common contact X1 or the potential at the common contact X2 is at high level, the non-redundancy flag f of low level is outputted from the third inverter 6, as mentioned previously.

Figure 7:
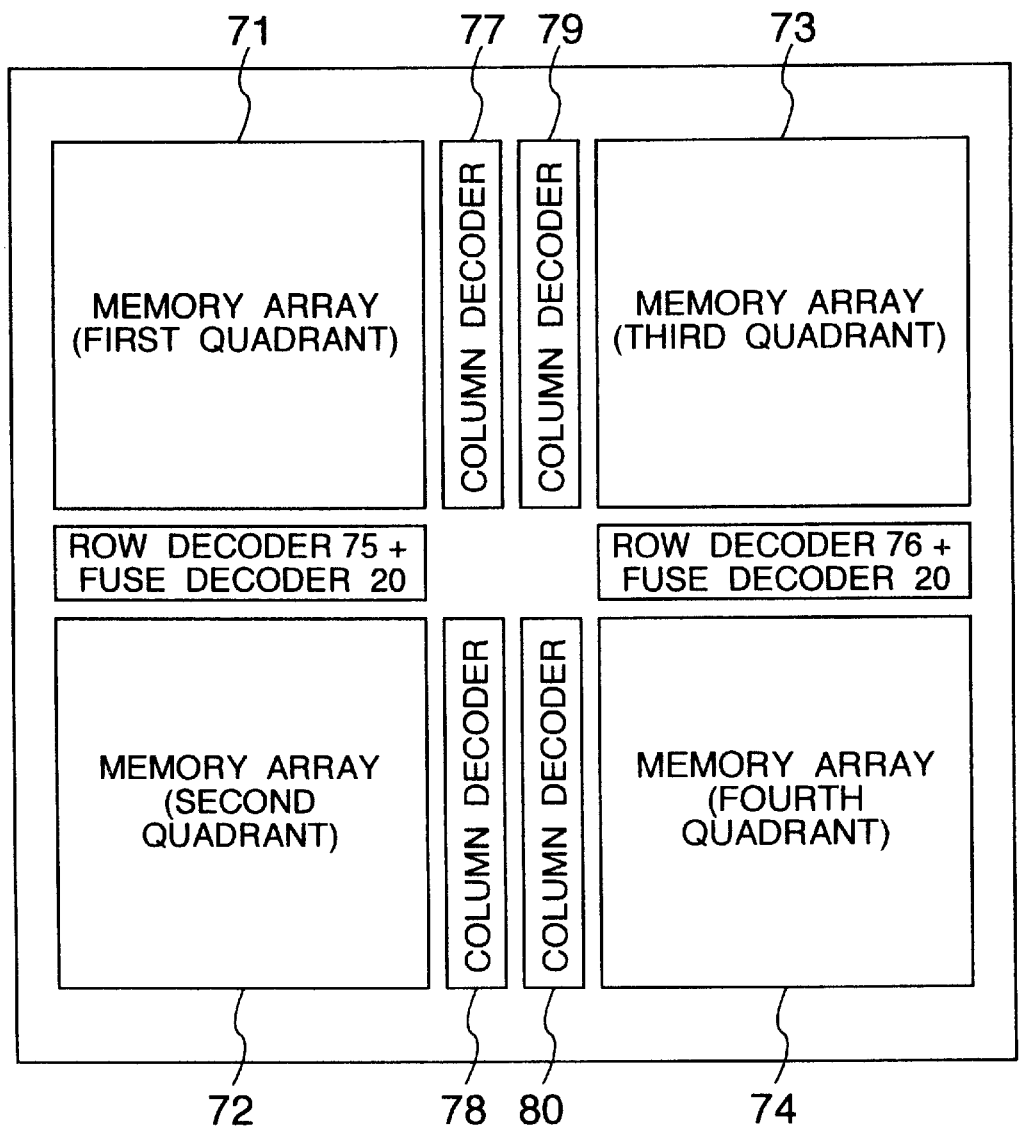
FIG. 7 is a view showing an exemplary layout of a semiconductor storage apparatus as a whole which apparatus is equipped with the redundancy circuit shown in FIG. 5.

The fuse decoder 20 is disposed together with a row decoder 75 between a memory array 71 disposed in the first quadrant and a memory array 72 disposed in the second quadrant while being disposed together with the a row decoder 76 between a memory array 73 disposed in the third quadrant and a memory array 74 disposed in the fourth quadrant, as shown in FIG. 7. Further, a column decoder 77 for the memory array 71 and a column decoder 79 for the memory array 73 are disposed between the memory array 71 and the memory array 72, while a column decoder 78 for the memory array 72 and a column decoder 80 for the memory array 74 are disposed between the memory array 72 and the memory array 74. With such arrangement, the semiconductor storage apparatus as a whole can be implemented in a compact structure because there arises no necessity for preparing a space to be dedicated to the fuse decoder 20.

Next, referring to FIG. 6, description will be made of an exemplary structure of the row decoder 75 and the fuse decoder 20 disposed between the memory array 71 disposed in the first quadrant and the memory array 72 disposed in the second quadrant.

The row decoder 75 is divided into eight row decoders RD1 to RD8, wherein each of the row decoders RD1 to RD8 manages sixty-four word line drivers WD1a to WD64a for the normal system memory cells of the memory array 71 disposed in the first quadrant on an eight-by-eight basis while controlling sixty-four word line drivers WD1b to WD64b for the normal system memory cells of the memory array 72 disposed in the second quadrant on an eight-by-eight basis. By way of example, the row decoder RD1 manages eight word line drivers WD1a to WD8a for the normal system memory cells of the memory array 71 and eight word line drivers WD1b to WD8b for the normal system memory cells of the memory array 72. In this context, because the replacement with the redundant system memory cell is carried out by handling the four word lines as one unit, as mentioned hereinbefore, each of the word line drivers is implemented for the four word lines constituting the one unit mentioned above.

Further, two word line drivers WD65a and WD66a for the redundant system memory cells of the memory array 71 disposed in the first quadrant as well as two word line drivers WD65b and WD66b for the redundant system memory cells of the memory array 72 disposed in the second quadrant are managed or controlled by the fuse decoder 20 which is disposed in the same column as the eight row decoders RD1 to RD8.

The row decoder RD1 includes an NMOS transistor TF for flag and an NMOS transistor T0 for upper digit which are connected in series to each other. The NMOS transistor TF for the flag has a gate terminal to which the non-redundancy flag f is inputted from the fuse decoder 20. Inputted to the gate terminals of the NMOS transistor TF for the flag and the NMOS transistor T0 for the upper digit is the internal address signal $a_0$ of the eight internal address signals $a_0$ to $a_7$ generated by pre-decoding the three-bit address signals $A_6$, $A_5$ and $A_4$ of the eight-bit address signals $A_0$ to $A_7$. Parenthetically, the other seven internal address signals $a_1$ to $a_7$ are inputted to the gate terminals of the NMOS transistor T0 for upper digit incorporated in the other row decoders RD2 to RD8.

The row decoder RD1 includes additionally eight NMOS transistors T8 to T15 for middle digits which are connected in parallel to one another. Inputted to the gate terminals of the NMOS transistors T8 to T15 for the middle digits are the eight internal address signals $a_8$ to $a_{15}$ generated by pre-decoding the three-bit address signals $A_2$, $A_1$ and $A_0$ of the eight-bit address signals $A_0$ to $A_7$, respectively. Since only one of the eight internal address signals $a_8$ to $a_{15}$ is at high level, only one of the eight NMOS transistors T8 to T15 for the middle digits becomes conductive.

The NMOS transistors T8 to T15 for the middle digits which are connected in parallel is connected in series to the NMOS transistor TF for the flag and the NMOS transistor T0 for the upper digit which are connected in series. Accordingly, when both the NMOS transistor TF for the flag and the NMOS transistor T0 for the upper digit are in the conducting state, the low level output signal of the NMOS transistor T8 for the middle digit is outputted to the word line drivers WD1a and WD1b in case the NMOS transistor T8 for the middle digit, for example, is in the conducting state. Besides, in case the NMOS transistor T10 for the middle digit, for example, is in the conducting state, the low level output signal of the NMOS transistor T10 for the middle digit is outputted to the word line drivers WD3a and WD3b. On the other hand, when at least one of the NMOS transistor TF for the flag and the NMOS transistor T0 for the upper digit is in the non-conducting state, a high-level output signal is supplied to the sixteen word line drivers WD1a to WD8a and WD1b to WD8b which are controlled by the row decoder RD1.

The word line driver WD1a includes an inverter 309a to which the output signal of the NMOS transistor T8 for the middle digit is inputted, and four NMOS transistors $310a_1$ to $310a_4$ having gate terminals to which the output signal of the inverter 309a is applied. In this conjunction, the four NMOS transistors $310a_1$ to $310a_4$ have source terminals applied with the four internal address signals $a_{16}$ to $a_{19}$, respectively, which are generated by pre-decoding the two-bit address signals $A_7$ and $A_3$ of the eight-bit address signals $A_0$ to $A_7$. Four word line select signals WL1 to WL4 are outputted onto the word line of the corresponding normal system memory cells from the drain terminals of the four NMOS transistors $310a_1$ to $310a_4$ via inverters.

When the signal of high level is inputted to the word line driver WD1a from the row decoder RD1, that signal is converted to low level by the inverter 309a to be subsequently inputted to the gate terminals of the four NMOS transistors $310a_1$ to $310a_4$. As a result of this, all the four NMOS transistors $310a_1$ to $310a_4$ assume the non-conducting state. Consequently, no selection of the word line can be effectuated in the word line driver WD1a.

On the other hand, when the signal of low level is inputted to the word line driver WD1a from the row decoder RD1, that signal is converted to high level by the inverter 309a to be subsequently inputted to the gate terminals of the four NMOS transistors $310a_1$ to $310a_4$. As a result of this, all the four NMOS transistors $310a_1$ to $310a_4$ assume the conducting state. Consequently, selection of the word line corresponding to one of the internal address signals $a_{16}$ to $a_{19}$ is effectuated in the word line driver WD1a.

The word line driver WD1b is realized in the structure similar to the word line driver WD1a and operates similarly to the word line driver WD1a.

Figure 6:
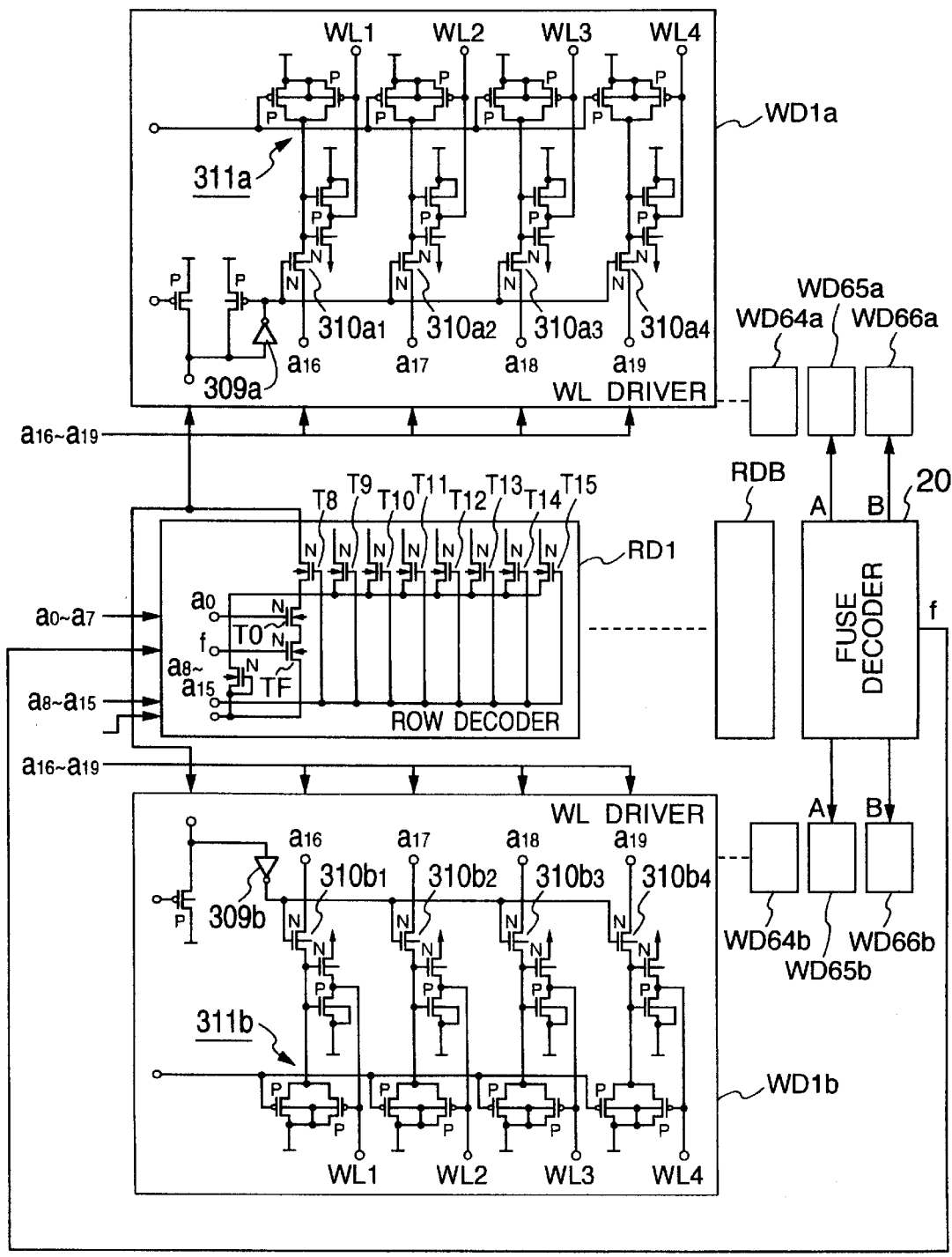
FIG. 6 is a fragmentary circuit diagram showing an example of a row decoder employed in a semiconductor storage apparatus equipped with the redundancy circuit shown in FIG. 5.

In this manner, in the row decoder 75 and the fuse decoder 20 shown in FIG. 6, decision as to whether use/nonuse of the normal system memory cell is validated by the non-redundancy flag f inputted from the fuse decoder 20 to the gate terminal of the NMOS transistor TF for the flag incorporated in the row decoders RD1 to RD8. Further, when the non-redundancy flag f is at high level, one of the eight row decoders RD1 to RD8 is selected by the internal address signals $a_0$ to $a_7$ which are inputted to the gate terminals of the NMOS transistors T0 to T7 for the upper digits incorporated in the eight row decoders RD1 to RD8, respectively.

In response to the internal address signals $a_8$ to $a_{15}$ which are inputted to the gate terminals of the NMOS transistors T8 to T15 for the middle digits incorporated in the row decoder selected in this way, one of the NMOS transistors T8 to T15 for the middle digits becomes conductive. As a result of this, the low level signal is inputted to one of the word line drivers WD1a to WD64a and WD1b to WD64b which corresponds to the NMOS transistor for the middle digit which becomes conductive, whereby one word line is selected by the internal address signals $a_{16}$ to $a_{19}$ inputted to the word line driver.

In this manner, when the non-redundancy flag f is at high level, enabling the use of the normal system memory cell, i.e., when the word line is selected by the word line drivers WD1a to WD64a and WD1b to WD64b for the normal system memory cell, the select signal A outputted from the source terminal of the first NMOS transistor 7a of the selecting circuit 13 to the word line drivers WD65a and WD66a and the select signal B outputted from the source terminal of the third NMOS transistor 8a to the word line drivers WD65b and WD66b for the redundant system memory cell are at high level, as described previously by reference to FIG. 5. As a result of this, the word line drivers WD65a, WD65b, WD66a and WD66b for the redundant system memory cell are set to non-activated state, disabling the use of the redundant system memory cell.

On the other hand, when the non-redundancy flag f outputted from the fuse decoder 20 is at low level, all the NMOS transistors TF for the flag incorporated in the row decoders RD1 to RD8 are set to the non-conducting state. As a result of this, all the word line drivers WD1a to WD64a and WD1b to WD64b for the normal system memory cell are set to non-activated state, disabling the use of the normal system memory cell. In that case, at least one of the select signal A outputted from the source terminal of the first NMOS transistor 7a of the selecting circuit 13 to the word line drivers WD65a and WD66a and the select signal B outputted from the source terminal of the third NMOS transistor 8a to the word line drivers WD65b and WD66b for the redundant system memory cell is at low level. As a result of this, one of the word line drivers WD65a, WD65b, WD66a and WD66b for the redundant system memory cell to which the select signal A or B of low level is inputted is set to activated state, enabling the use of the redundant system memory cell.

As is apparent from the foregoing, in the redundancy circuit for the semiconductor storage apparatus according to the instant embodiment, the use/nonuse of the normal system memory cell is decided on the basis of the address signal as inputted, wherein when the normal system memory cells are to be used, the word line drivers WD65a, WD65b, WD66a and WD66b for the redundant system memory cell are set to the non-activated state, disabling the use of the redundant system memory cell. On the other hand, when the normal system memory cell is not to be used, the fuse decoder 20 plays the role of selecting the word line drivers WD65a, WD65b, WD66a and WD66b for the redundant system memory cell in place of the address decoder for the redundant system memory cell shown in FIG. 5, while all the word line drivers WD1a to WD64a and WD1b to WD64b for the normal system memory cell are set to the non-activated state, disabling the use of the normal system memory cell.

More specifically, in the redundancy circuit for the semiconductor storage apparatus according to the instant embodiment, because the use of the normal system memory cell can be disabled without breaking the disable fuse provided for each of the word lines, not only decision as to the use/nonuse of the normal system memory cell and disabling of the use of the normal system memory cell can simultaneously be effectuated, but also the problem concerning the wiring layout can be solved as well. Besides, because disabling of the use of the normal system memory cell and selection of the redundant system memory cell can simultaneously be realized by means of the fuse and the MOS transistor, the time taken for selecting the redundant system memory cell can be shortened. Additionally, the circuit can be implemented with an extremely small number of elements without need for disposition of extraneous wiring such as illustrated in FIG. 7, whereby the semiconductor storage apparatus as a whole can be implemented on a small circuit scale.

As will be appreciated from the foregoing description, the redundancy circuit for the semiconductor storage apparatus according to the present invention is so arranged that the use/nonuse of the normal system memory cell is decided on the basis of the output signal from a set of fuse circuits, and the conducting/non-conducting state of the MOS transistor connected to the address decoder for the normal system memory cell is changed over by the non-redundancy flag outputted on the basis of the result of the decision mentioned above. Thus, upon inputting of the defect address, the use of the normal system memory cell is disabled with the non-redundancy flag assuming low level, whereby the use of the normal system memory cell can be disabled without resorting to the use of the disable fuse or the like. Thus, the decision as to the use/nonuse of the normal system memory cell and disabling of the use of the normal system memory cell can be effectuated at the same time. Furthermore, when the non-redundancy decision means is constituted by the logical sum gate means, the circuit for making decisions as to the use/nonuse of the normal system memory cell can be implemented in a simplified structure with the time taken for making the decision being shortened.

Additionally, the redundancy circuit for the semiconductor storage apparatus according to the present invention further includes the address selecting means for outputting the select signal which enables the use of the redundant system memory cell when a plurality of signals outputted from one set of fuse circuits have mutually different signal levels. Thus, when the defect address is inputted, the non-redundancy flag becomes, for example, low, disabling the use of the normal system memory cell while enabling the use of the redundant system memory cell with the aid of the address select signal, whereby disabling of the use of the normal system memory cell and selection of the redundant system memory cell can simultaneously be effectuated. As a consequence, the time taken for the selection of the redundant system memory cell can be shortened, whereby the processing speed of the semiconductor storage apparatus as a whole can be increased. Besides, because selection of the redundant system memory cell can be realized with a small number of elements such as one set of fuse circuits and four MOS transistors, the circuit scale can be reduced.

Besides, in the redundancy circuit for the semiconductor storage apparatus according to the present invention, the fuse decoder constituted by one set of fuse circuits, the non-redundancy decision means and the address selecting means is disposed in the vicinity of the address decoder, extraneous wiring can be obviated, which contributes to further reduction in the circuit scale and enhancement of the processing speed.

What is claimed is:

1. A redundancy circuit for a semiconductor storage apparatus for controlling replacement of a normal system memory cell by a redundant system memory cell, said circuit comprising:

first and second fuse circuits each including fuses provided in correspondence to individual bits of an address signal constituted by a plurality of bits for designating an address of said normal system memory cell, and each outputting an output signal of high level or low level in dependence on whether or not said fuse is broken;

non-redundancy decision means for deciding whether or not said normal system memory cell is to be used on the basis of output signals of said first and second fuse circuits to thereby output a non-redundancy flag indicating result of said decision;

a MOS transistor having a gate terminal applied with said non-redundancy flag, and being changed over between a conducting state and a non-conducting state in dependence on said non-redundancy flag; and an address decoder for said normal system memory cell for decoding said address signal when said MOS transistor is in the conducting state.

2. A redundancy circuit for a semiconductor storage apparatus set forth in claim 1, wherein said non-redundancy decision means includes logical sum gate means for determining a logical sum between the output signal of said first fuse circuit and the output signal of said second fuse circuit.

3. A redundancy circuit for a semiconductor storage apparatus set forth in claim 1, further comprising:

address selecting means for outputting a select signal for allowing said normal system memory cell to be replaced by said redundant system memory cell when the output signal of said first fuse circuit and the output signal of said second fuse circuit have respective signal levels differing from each other.

4. A redundancy circuit for a semiconductor storage apparatus set forth in claim 2, further comprising:

address selecting means for outputting a select signal for allowing said normal system memory cell to be replaced by said redundant system memory cell when the output signal of said first fuse circuit and the output signal of said second fuse circuit have respective signal levels differing from each other.

5. A redundancy circuit for a semiconductor storage apparatus set forth in claim 3, wherein said address selecting means comprises:

a first inverter for inverting the signal level of the output signal of said first fuse circuit;

a first MOS transistor having a gate terminal to which an output signal of said first inverter is applied, and being changed over between a conducting state and a non-conducting state in dependence on signal level of the output signal of said first inverter;

a second MOS transistor having a gate terminal to which an output signal of said second fuse circuit is applied, and being changed over between a conducting state and a non-conducting state in dependence on signal level of the output signal of said second fuse circuit;

a second inverter for inverting the signal level of the output signal of said second fuse circuit;

a third MOS transistor having a gate terminal to which an output signal of said second inverter is applied, and being changed over between a conducting state and a non-conducting state in dependence on signal level of the output signal of said second inverter; and a fourth MOS transistor having a gate terminal to which an output signal of said first fuse circuit is applied, and being changed over between a conducting state and a non-conducting state in dependence on the signal level of the output signal of said first fuse circuit, said first MOS transistor and said second MOS transistor are connected in series to each other, said third MOS transistor and said fourth MOS transistor are connected in series to each other, and said select signal is outputted from a connecting point between said first MOS transistor and second MOS transistor and a connecting point between said third MOS transistor and said fourth MOS transistor.

6. A redundancy circuit for a semiconductor storage apparatus set forth in claim 4, wherein said address selecting means comprises:

a first inverter for inverting signal level of the output signal of said first fuse circuit;

a first MOS transistor having a gate terminal to which an output signal of said first inverter is applied, and being changed over between a conducting state and a non-conducting state in dependence on signal level of the output signal of said first inverter;

a second MOS transistor having a gate terminal to which an output signal of said second fuse circuit is applied, and being changed over between a conducting state and a non-conducting state in dependence on signal level of the output signal of said second fuse circuit;

a second inverter for inverting the signal level of the output signal of said second fuse circuit;

a third MOS transistor having a gate terminal to which an output signal of said second inverter is applied, and being changed over between a conducting state and a non-conducting state in dependence on signal level of the output signal of said second inverter; and a fourth MOS transistor having a gate terminal to which an output signal of said first fuse circuit is applied, and being changed over between a conducting state and a non-conducting state in dependence on signal level of the output signal of said first fuse circuit, said first MOS transistor and said second MOS transistor are connected in series to each other, said third MOS transistor and said fourth MOS transistor are connected in series to each other, and said select signal is outputted from a connecting point between said first MOS transistor and second MOS transistor and a connecting point between said third MOS transistor and said fourth MOS transistor.

7. A redundancy circuit for a semiconductor storage apparatus set forth in claim 3, wherein a fuse decoder constituted by said first and second fuse circuits, said non-redundancy decision means and said address selecting means is disposed closely to said address decoder.

8. A redundancy circuit for a semiconductor storage apparatus set forth in claim 4, wherein a fuse decoder constituted by said first and second fuse circuits, said non-redundancy decision means and said address selecting means is disposed closely to said address decoder.

9. A redundancy circuit for a semiconductor storage apparatus set forth in claim 5, wherein a fuse decoder constituted by said first and second fuse circuits, said non-redundancy decision means and said address selecting means is disposed closely to said address decoder.

10. A redundancy circuit for a semiconductor storage apparatus set forth in claim 6, wherein a fuse decoder constituted by said first and second fuse circuits, said non-redundancy decision means and said address selecting means is disposed closely to said address decoder.

* * * * *